United States Patent [19]
Tanaka et al.

[11] Patent Number: 5,801,550
[45] Date of Patent: Sep. 1, 1998

[54] OUTPUT CIRCUIT DEVICE PREVENTING OVERSHOOT AND UNDERSHOOT

[75] Inventors: Yasunori Tanaka, Yokosuka; Ikue Yamamoto, Yokohama, both of Japan

[73] Assignee: Kabushiki Kaisha Toshiba, Kawasaki, Japan

[21] Appl. No.: 564,499

[22] Filed: Nov. 29, 1995

[30] Foreign Application Priority Data

Nov. 30, 1994 [JP] Japan ................. 6-297177

[51] Int. Cl.$^6$ ................. H03K 17/16; H03K 19/0175
[52] U.S. Cl. ................. 326/87; 326/27; 326/34; 327/110
[58] Field of Search ................. 326/27, 21, 34, 326/83, 87; 327/110, 111, 112

[56] References Cited

U.S. PATENT DOCUMENTS

| | | | |
|---|---|---|---|
| 4,829,199 | 5/1989 | Prater | 326/27 |
| 4,961,010 | 10/1990 | Davis | 326/27 |
| 5,212,801 | 5/1993 | Farmer | 326/27 |
| 5,517,129 | 5/1996 | Matsui | 326/27 |
| 5,534,791 | 7/1996 | Mattos et al. | 326/27 |

*Primary Examiner*—Edward P. Westin
*Assistant Examiner*—Richard Roseen
*Attorney, Agent, or Firm*—Foley & Lardner

[57] ABSTRACT

The pulse output circuit device comprises two transistors (2, 4) for constructing an output buffer, a transistor (7) connected between the output line (OUTP) of the output buffer and the high potential supply voltage (VDD), a transistor (8) connected between the output line (OUT) of the output buffer and the low potential supply voltage (GND), a control circuit (39) for applying a gate signal to the transistor (7), and a control circuit (40) for applying a gate signal to the transistor (8). Whenever the signal level of the output buffer changes, the two control circuits (39, 40) turn on the transistor (7) or the transistor (8) for sharp level transition at the start of level transition, but turn on the transistor (7) or the transistor (8) on the basis of the relationship between the output level of the control circuit (39, 40) and the operating point of the transistor (7) or the transistor (8) at the end of level transition for absorption of the charge and discharge current to and from a parasitic capacitance (27). In the pulse output circuit device, it is possible to effectively prevent overshoot and undershoot caused when a pulse signal is outputted therethrough, while keeping the high output response speed and without increasing the circuit area.

21 Claims, 9 Drawing Sheets

OUTPUT CIRCUIT DEVICE PREVENTING OVERSHOOT AND UNDERSHOOT

FIELD OF THE INVENTION

The present invention relates to an output circuit device, and more specifically to a semiconductor pulse output circuit device.

BACKGROUND OF THE INVENTION

A first example of prior art pulse output circuit devices will be described hereinbelow with reference to FIG. 9.

Figure 9:
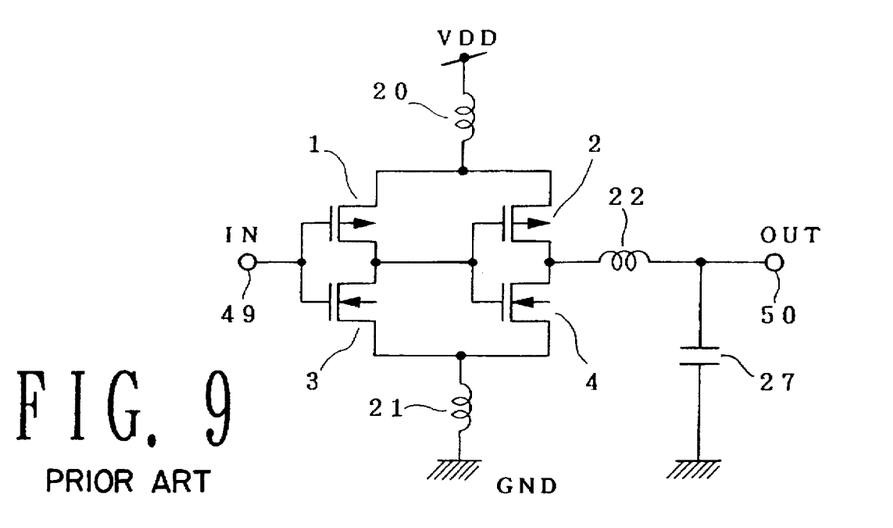
FIG. 9 is a circuit diagram showing the first example of the prior art pulse output circuit device.

In FIG. 9, the sources of two P-channel MOS transistors 1 and 2 are connected to a high potential supply voltage VDD, and the sources of two N-channel MOS transistors 3 and 4 are connected to a low potential supply voltage GND. Further, the respective drains of the transistors 1 and 3 are connected to each other so as to form a complementary structure. In the same way, the respective drains of the transistors 2 and 4 are connected to each other so as to form a complementary structure.

The gates of the two transistors 1 and 3 are connected to an input terminal 49 to which an input signal IN is applied. On the other hand, the gates of the two transistors 2 and 4 are connected to the drains of the two transistors 1 and 3. The drains of the two transistors 2 and 4 are connected in common to an output terminal 50 from which an output signal OUT is transmitted.

Here, a parasitic inductance 20 exists between the sources of the transistors 1 and 2 and the high potential supply voltage VDD, and another parasitic inductance 21 exists between the sources of the transistors 3 and 4 and the low potential supply voltage GND. Further, another parasitic inductance 22 exists between the drains of the transistors 2 and 4 and the output terminal 50, and a parasitic capacitance 27 exists between the output terminal 50 and the low potential supply voltage GND.

The parasitic inductances 20, 21 and 22 are caused by the presence of the package leads, bonding wires, etc. of the semiconductor circuit, and the parasitic capacitance 27 is caused by a load capacitance of a pin connected to the output terminal 50.

The two transistors 1 and 3 serve as an input buffer for the input signal IN applied to the input terminal 49, and the two transistors 2 and 4 serve as an output buffer for transmitting the output signal OUT from the output terminal 50.

The operation of the circuit shown in FIG. 9 will be explained with reference to a waveform diagram shown in FIG. 10.

Figure 10:
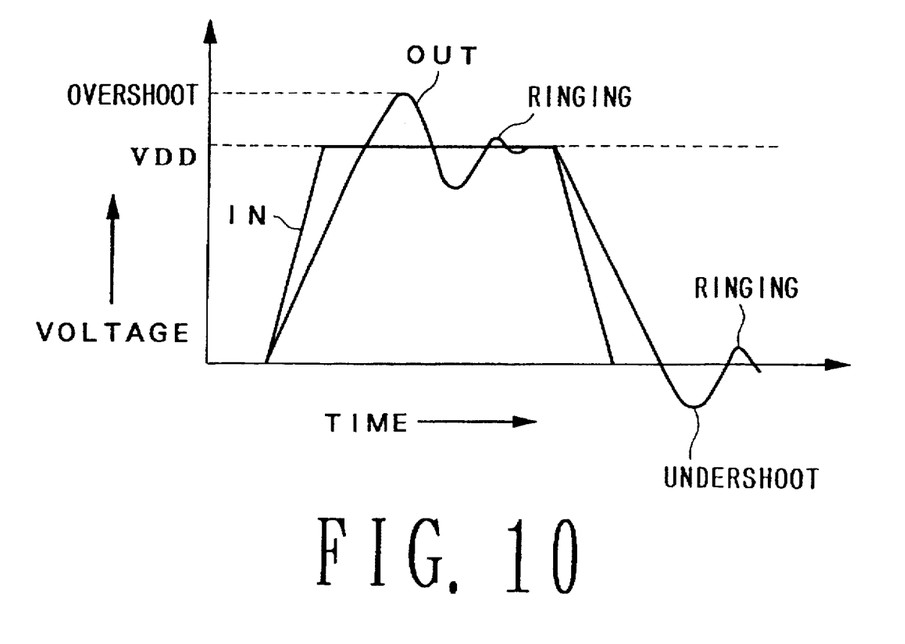
FIG. 10 is a waveform diagram for assistance in explaining the operation of the pulse output circuit device shown in FIG. 9.

Here, the assumption is made than an input signal IN is inputted through the input terminal 49 as a pulse, as shown in FIG. 10. Then, the input pulse signal IN is inverted by the complementary circuit of the two transistors 1 and 3, and further inverted by the complementary circuit of the two transistors 2 and 4, before outputted through the output terminal 50 as the output signal OUT.

In the above-mentioned operation, the parasitic capacitance 27 is charged and discharged by the switching operation of the two transistors 2 and 4, so that a back (reversed) electromotive force is inevitably generated by transient current flowing through the parasitic inductances 20, 21 and 22 existing on the sides of the high potential supply voltage VDD, the low potential supply voltage GND and the output terminal 50, respectively. In addition, the generated reversed electromotive force is resonated due to the presence of the parasitic capacitance 27. As a result, the waveform of the pulse outputted through the output terminal 50 overshoots and further vibrates (referred to as ringing) when the pulse rises, and undershoots and further vibrates when falls, both as shown in FIG. 10.

Since these overshoot, undershoot and ringing cause the high level and the low level pulse signal to fluctuate, there exists a possibility that an erroneous pulse level is transmitted, thus causing a data error when the pulse output circuit device is used as the data output circuit device.

Further, since the pulse output circuit device transmits an output signal higher or lower beyond the ordinary operation level range to another external circuit chip connected to the output terminal 50 thereof, this causes a latch up of the external circuit connected the output terminal 50.

Further, the modes of the overshoot, undershoot and ringing phenomenon are decided according to the supply voltage, the parasitic capacitance of the pulse output circuit device, the inductive load of the wiring, the ion resistance of the drive elements, etc. Recently, therefore, the above-mentioned phenomena tend to cause a serious problem more and more due to an increase of buffer driving capability, an increase of inductive load of wiring, etc. in accompany with the higher integration rate and higher operation speed of the semiconductor circuits.

A second example of the pulse output circuit device will be described hereinbelow with reference to FIG. 11, which is constructed to prevent the above-mentioned overshoot and undershoot, in particular.

Figure 11:
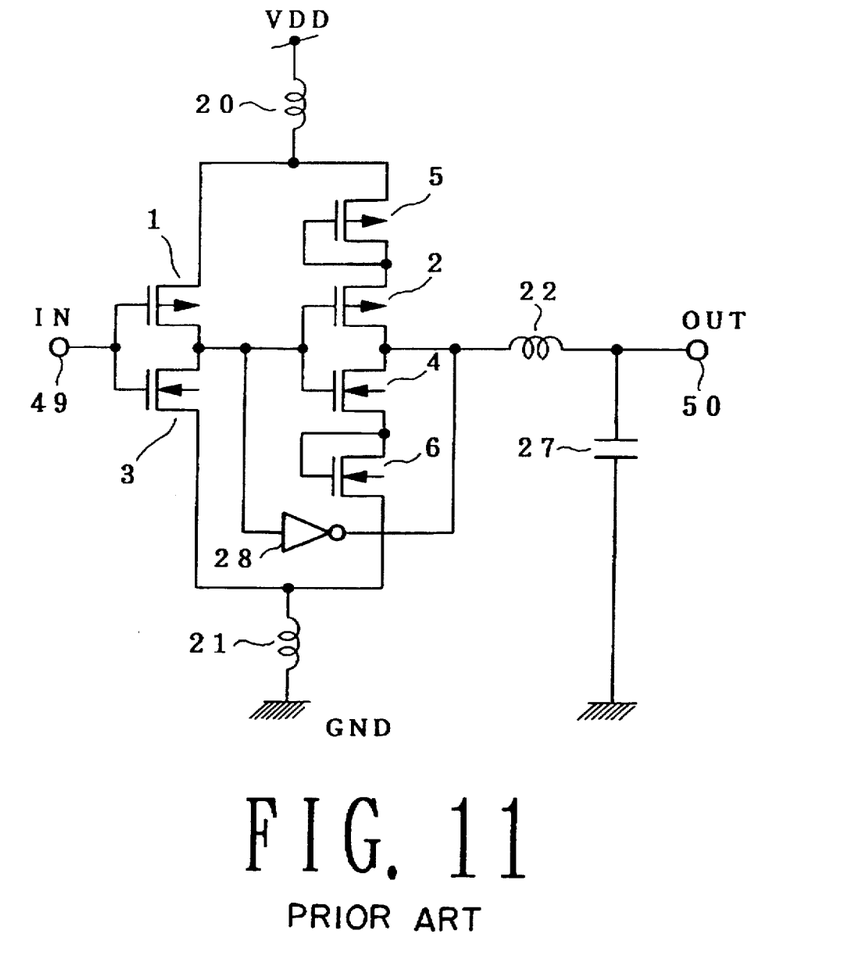
FIG. 11 is a circuit diagram showing the second example of the prior art pulse output circuit device.

In FIG. 11, the source of the transistor 2 is connected to a high potential supply voltage VDD via a P-channel MOS transistor 5, and the source of the transistor 4 is connected to the low potential supply voltage GND via an N-channel MOS transistor 6. On the other hand, an input of an inverter 28 is connected to the drains of the two transistors 1 and 3 (that is, the gates of the two transistors 2 and 4) and an output of the inverter 28 is connected to the drains of the two transistors 2 and 4.

Further, the parasitic inductance 20 exists on the side of the high potential supply voltage VDD; the parasitic inductance 21 exists on the side of the low potential supply voltage GND; the parasitic inductance 22 exists on the side of the output terminal 50; and the parasitic capacitance 27 exists in the output terminal 50.

The transistor 5 serves as a resistance on the source side of the transistor 2, and the transistor 6 serves as a resistance on the source side of the transistor 4. Further, the inverter 28 serves as a compensation circuit for setting the final output voltage at the output terminal 50 to the high potential supply voltage (VDD) level or the low potential supply voltage (GND) level, respectively.

The operation of the circuit shown in FIG. 11 will be explained with reference to a waveform diagram shown in FIG. 12.

Figure 12:
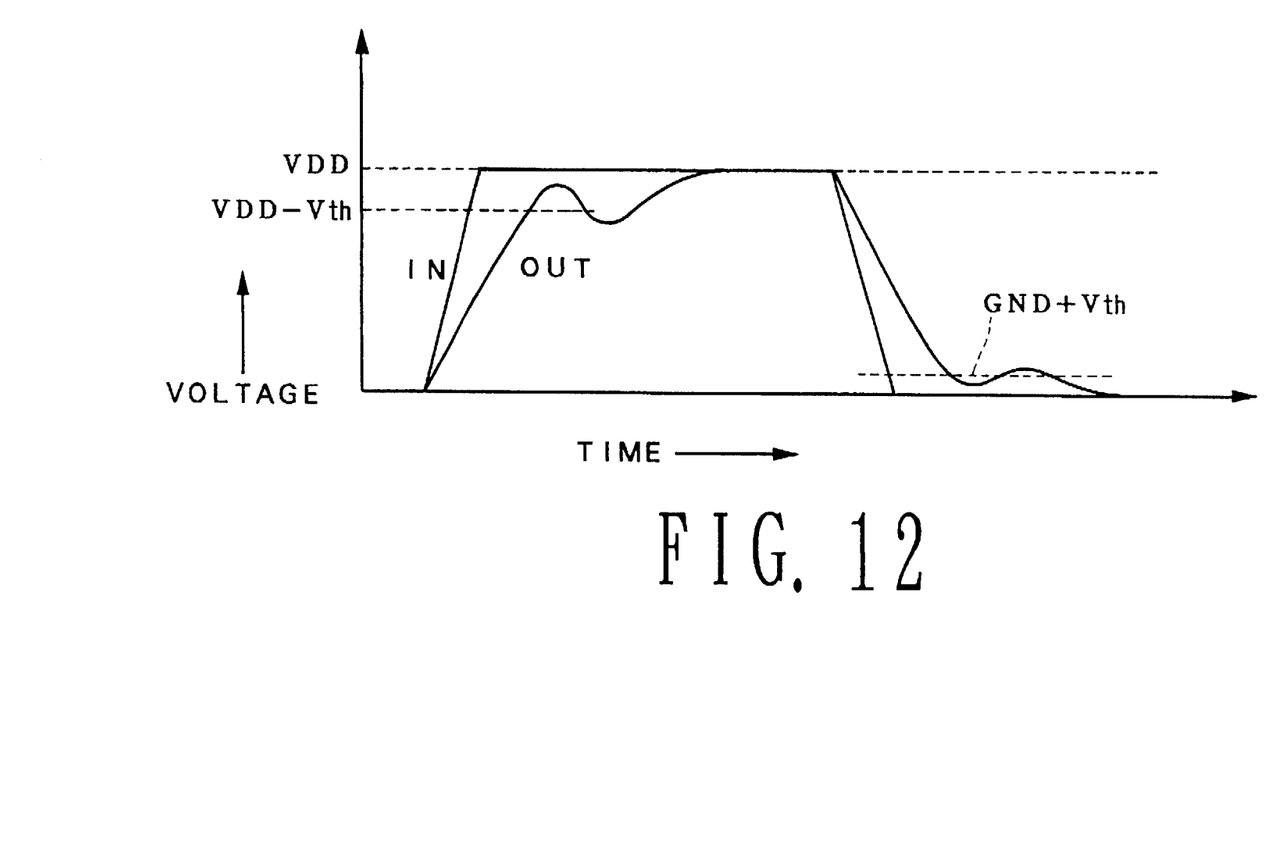
FIG. 12 is a waveform diagram for assistance in explaining the operation of the circuit device shown in FIG. 11.

Here, the assumption is made that an input signal IN is inputted through the input terminal 49 as a pulse, as shown in FIG. 12. Then, the pulse signal IN is inverted by the complementary circuit of the two transistors 1 and 3, and further inverted by the complementary circuit of the two transistors 2 and 4, before being outputted through the output terminal 50 as the output signal OUT.

In the above-mentioned operation, the parasitic capacitance 27 is charged and discharged by the switching operation of the two transistors 2 and 4. Here, however, since the charge or discharge current is limited by the transistor 5 or 6, the generated overshoot can be suppressed by a voltage corresponding to the threshold voltage of the transistor 5 and, in the same way, the generated undershoot can be suppressed by a voltage corresponding to the threshold voltage of the transistor 6. That is, the two transistors 5 and 6 operate as a so-called clamp circuit, respectively. Here, when the threshold voltage of the transistors 5 and 6 is denoted by Vth, the positive supply voltage becomes equivalent to the voltage lower than the high potential supply voltage VDD by the threshold voltage Vth, and the negative supply voltage is equivalent to the voltage higher than the low potential supply voltage GND by the threshold voltage Vth, as shown in FIG. 12. As a result, the output characteristics of the output signal OUT transmitted through the output terminal 50 are such that the overshoot voltage can be decreased by the threshold voltage Vth and the undershoot voltage can be increased by the threshold voltage Vth.

As described above, since the output voltages of the overshoot and undershoot can be both suppressed, it is possible to prevent the erroneous operation of the latch-up of the external circuit connected to the output terminal 50, which has been so far involved as a problem in the pulse output circuit device.

Further, after the transient overshoot, undershoot and ringing are suppressed, the voltage level of the output signal OUT is decided finally at the high potential supply voltage VDD or the low potential supply voltage GND by the operation of the inverter 28, respectively.

In the prior art circuit construction as described above, however, there exists a problem in that the driving capability for a load connected to the output terminal 50 is reduced by the current limitation of the transistors 5 and 6. In other words, since current is supplied through the series-connected transistors 2 and 5 on the high level side and since current is pulled down through the series-connected transistors 4 and 6 on the lower level side, when the load driving capability the same as that of the circuit shown in FIG. 9 is required, the circuit dimensions (circuit area) four times broader than that of the circuit shown in FIG. 9 are necessary. This causes a serious problem when the higher integration rate of the semiconductor circuit is now being required.

As described above, in the prior art pulse output circuit devices, there exists a problem in that the output circuit device is operated erroneously or the external circuit is latched up due to the overshoot or the undershoot. To overcome this problem, current limiting transistors have been so far connected in series to the output stage buffer. In this case, however, another problem arises in that when the current supply capability is required to be increased, the transistor area for the output buffer must be increased markedly.

SUMMARY OF THE INVENTION

Accordingly, it is the object of the present invention to provide an output circuit device which can effectively suppress the overshoot and undershoot generated when a pulse signal is outputted therethrough, in spite of a small circuit area.

To achieve the above-mentioned object, the present invention provides an output circuit device, comprising: an input terminal; an output terminal; a buffer having a buffer input terminal connected to said input terminal and a buffer output terminal connected to said output terminal, for outputting a pulse output through the buffer output terminal in a response to a pulse input applied to said input terminal; an N-channel transistor and a P-channel transistor, a drain of said N-channel transistor being connected to a high potential supply voltage, a source of said N-channel transistor being connected to a source of said P-channel transistor, a drain of said P-channel transistor being connected to a low potential supply voltage, and a junction point between said N-channel transistor and said P-channel transistors being connected to the buffer output terminal; a first control circuit having a first input terminal connected to said input terminal, a second input terminal connected to the buffer output terminal, and a first output terminal connected to a gate of said N-channel transistor, whenever a level of a pulse applied to said input terminal changes, said first control circuit outputting a first control signal for first turning on said N-channel transistor and then turning off said same transistor after a constant time has elapsed through the first input terminal thereof on the basis of inputs applied to the first and second input terminals thereof; and a second control circuit having a third input terminal connected to said input terminal, a fourth input terminal connected to the buffer output terminal, and a second output terminal connected to a gate of said P-channel transistor, whenever the level of the pulse applied to said input terminal changes, said second control circuit outputting a second control signal for first turning on said P-channel transistor and then turning off said same transistor after a constant time has elapsed through the second input terminal thereof on the basis of inputs applied to the third and fourth input terminals thereof.

Further, the present invention provides an output circuit device, comprising: an input terminal; an output terminal; a buffer having a buffer input terminal connected to said input terminal and a buffer output terminal connected to said output terminal, for outputting a pulse output through the buffer output terminal in response to a pulse input applied to said input terminal; an N-channel transistor and a P-channel transistor, a drain of said N-channel transistor being connected to a high potential supply voltage, a source of said N-channel transistor being connected to a source of said P-channel transistor, a drain of said P-channel transistor being connected to a low potential supply voltage, and a junction point between said N-channel transistor and said P-channel transistors being connected to the buffer output terminal; a first delay circuit having an input terminal connected to the buffer output terminal of said buffer and an output terminal connected to a gate of said N-channel transistor; and a second delay circuit having an input terminal connected to the buffer output terminal of said buffer and an output terminal connected to a gate of said P-channel transistor.

In the output circuit device according to the present invention, when the signal of the output buffer rises from the low level to the high level, overshoot is prevented by turning on the N-channel MOS transistor sharply at the start of pulse rise, and by absorbing charge current to the parasitic capacitance by turning on the P-channel MOS transistor at the end of the pulse rise.

Further, when the signal of the output buffer falls from the high level to the low level, undershoot is prevented by turning on the P-channel MOS transistor sharply at the start of pulse rise, and by absorbing discharge current from the parasitic capacitance by turning on the N-channel MOS transistor at the end of the pulse rise.

DETAILED DESCRIPTION OF THE EMBODIMENTS

The embodiments of the pulse output circuit device according to the present invention will be described hereinbelow with reference to the attached drawings.

Figure 1:
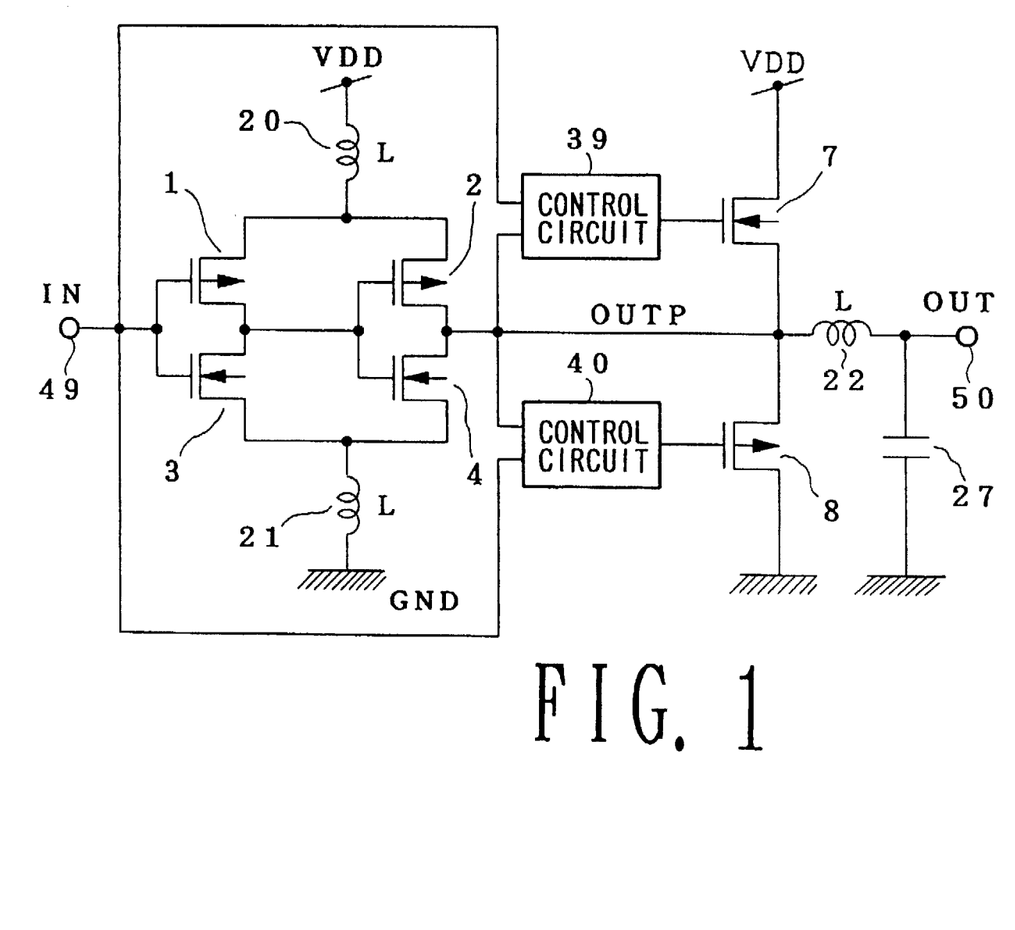
FIG. 1 is a circuit diagram showing a first embodiment of the pulse output circuit device according to the present invention.

FIG. 1 shows a first embodiment of the pulse output circuit device according to the present invention.

In the drawing, an N-channel MOS transistor 7 and a P-channel transistor 8, and two control circuits 39 and 40 are additionally connected to the prior art pulse output circuit device shown in FIG. 9.

In more detail, an output signal OUT is transmitted from an output buffer of two complementary-connected transistors 2 and 4 through an output line OUTP and an output terminal 50. To the output line OUTP, the N-channel MOS transistor 7 and the P-channel MOS transistor 8 are connected as auxiliary transistors. The drain of the transistor 7 is connected to a high potential supply voltage VDD, and the rain of the transistor 8 is connected to a low potential supply voltage GND. These transistors 7 and 8 form two bypass circuits to the high and low supply voltages VDD and GND, respectively. Further, an output signal is applied to the gate of the transistor 7 from the control circuit 39, and another output signal is applied to the gate of the transistor 8 from the control circuit 40. These two control circuits 39 and 40 control each gate potential of the two transistors 7 and 8 to decide the operating point and the operation thereof.

To the two control circuits 39 and 40, an input terminal 49 is connected to apply an input signal IN, and the output line OUTP is connected to apply an output signal of the transistors 2 and 4, respectively. That is, the two control circuits 39 and 40 control each gate potential of the transistors 7 and 8 on the basis of either one or both of the input signal IN and the signal of the output line OUTP. The control circuits 39 and 40 have such functions as to apply a high level signal to the gate of the transistor 7 and a low level signal to the gate of the transistor 8 to turn on these transistors 7 and 8, respectively for a predetermined period after the input signal IN has changed; but to apply a low level signal to the gate of the transistor 7 and a high level signal to the gate of the transistor 8 to turn off these transistors 7 and 8, respectively after a predetermined time has elapsed.

Figure 2:
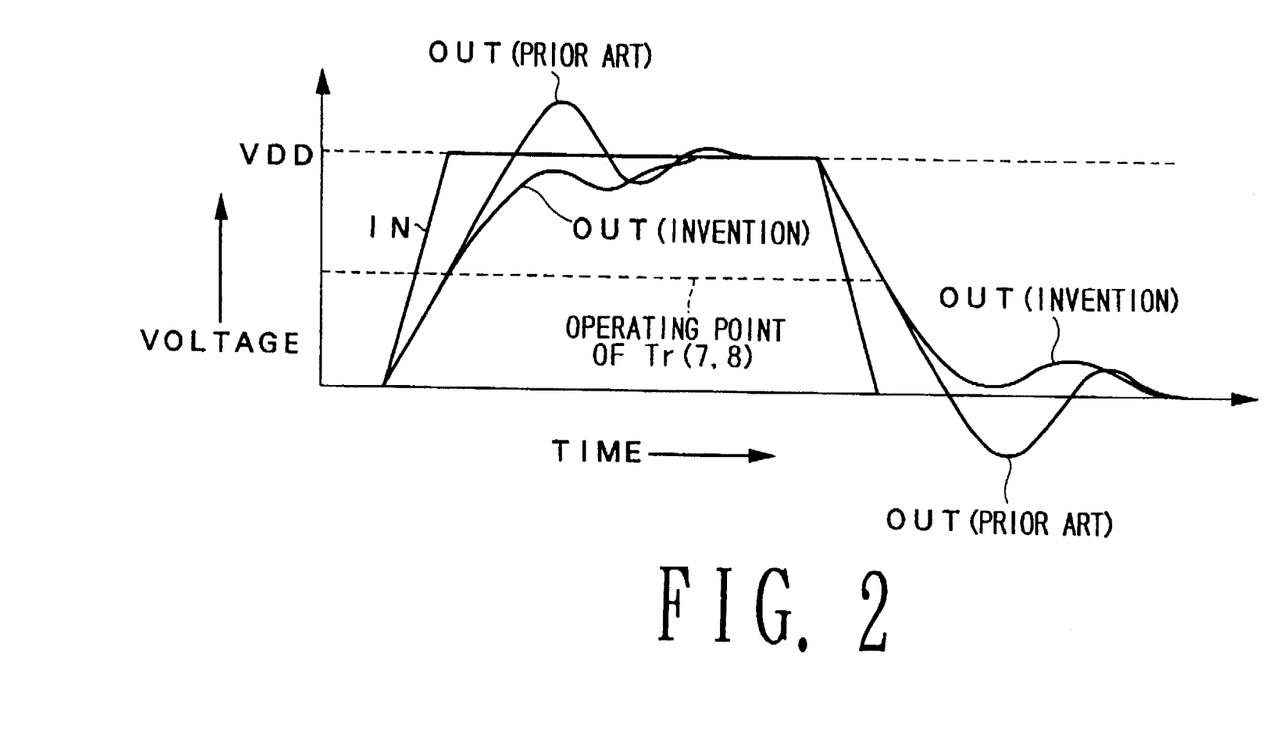
FIG. 2 is a waveform diagram for assistance in explaining the operation of the pulse output circuit device shown in FIG. 1.

The operation of the circuit device shown in FIG. 1 will be explained hereinbelow with reference to FIG. 2.

Now, when the input signal IN is at the low level, the transistor 1 is turned on and the transistor 3 is turned off, so that the output of the input buffer is at the high level. As a result, the transistor 2 is turned off and the transistor 4 is turned on, so that the output line OUTP and the output terminal 50 are both at the low level. At this time, the control circuit 39 outputs a signal for turning off the transistor 7, and the control circuit 40 outputs a signal for turning off the transistor 8, respectively.

Then, the case where the input signal IN rises from the low potential supply voltage GND to the high potential supply voltage VDD will be taken into account.

When the input signal IN rises to the high level, the transistor 2 is turned on and the transistor 4 is turned off, so that charge current begins to flow to the parasitic capacitance 27. As a result, the potential of the output line OUTP increases gradually. Simultaneously when the input signal IN reaches the high level, the control circuit 39 outputs the high level gate signal to the transistor 7, and the control circuit 40 outputs the low level gate signal to the transistor 8, respectively. As a result, since the transistor 7 is turned on, the transistor 7 is changed to such a status that current flows between the drain and the source thereof. In this case, however, no current flows between the source and the drain of the transistor 8, until the voltage of the output line OUTP reaches a predetermined value (the operating point voltage). In other words, the transistor 8 is not set to such a status that current flows between the source and the drain thereof, until the potential of the output line OUTP rises beyond an intrinsic element threshold voltage. As a result, the parasitic capacitance 27 is charged by the two transistors 2 and 7 at a relatively high speed, so that the output signal OUT rises sharply.

After that, when the voltage of the output line OUTP rises up to near the operating point of the transistors 7 and 8, current begins to flow between the source and the drain of the transistor 8, so that the current of the transistor 7 begins to be suppressed sharply on the basis of the back gate bias effect. On the other hand, although the parasitic capacitance 27 is kept charged by the transistor 7, this charge current is absorbed by the transistor 8. Therefore, the final voltage of the output line OUTP is set to a value decided by the on-resistance ratio of the transistor 2 to the transistor 8, that is, a voltage level several tens of mVs lower than the high potential supply voltage VDD. As a result, it is possible to suppress the overshoot.

At this time, however, since current is flowing through the transistors 2 and 8, this is not preferable from the standpoints of power consumption suppression and of the setting of the output signal (OUT) level to the high potential supply voltage VDD. Therefore, after a predetermined time has elapsed after the input signal IN rises from the low level to the high level, the control circuits 39 and 40 output gate signals for turning off both the transistors 7 and 8. As a result, it is possible to suppress current from flowing from the transistor 2 to the transistor 8 and to decide the level of the output signal OUT by only the turn-on operation of only the transistor 2, so that the output signal (OUT) level is set to the high potential supply voltage VDD.

Next, the case where the input signal IN falls from the high potential supply voltage VDD to the low potential supply voltage GND will be taken into account.

When the input signal IN falls to the low level, the transistor 4 is turned on and the transistor 2 is turned off, so that the potential at the output line OUTP decreases gradually.

Further, simultaneously when the input signal IN falls to the level, the control circuit 39 outputs the high level gate signal to the transistor 7, and the control circuit 40 outputs the low level gate signal to the transistor 8, respectively. As a result, since the transistor 8 is turned on, the transistor 8 is changed to such a status that current flows between the source and the drain thereof. In this case, however, no current flows between the drain and the source of the transistor 7, until the voltage of the output line OUTP reaches a predetermined value (the operating point voltage). In other words, the transistor 7 is not set to such a status that current flows between the drain and the source thereof, until the potential of the output line OUTP drops below the intrinsic element threshold voltage. As a result, the parasitic capacitance 27 is discharged by the two transistors 4 and 8 at a relatively high speed, so that the output signal OUT falls sharply.

After that, when the voltage of the output line OUTP falls down to near the operating point of the transistors 7 and 8, current begins to flow between the drain and the source of the transistor 7, so that the current of the transistor 8 begins to be suppressed sharply on the basis of the back gate bias effect. On the other hand, although the parasitic capacitance 27 is kept discharged by the transistor 7, this discharge current is absorbed by the transistor 7. Therefore, the final voltage of the output line OUTP is set to a value decided by the on-resistance ratio of the transistor 4 to the transistor 7, that is, a voltage level several tens of mVs higher than the low potential supply voltage GND. As a result, it is possible to suppress the undershoot.

At this time, however, since current is flowing through the transistors 7 and 4, this is not preferable from the standpoints of power consumption suppression and of the setting of the output signal (OUT) level to the low potential supply voltage GND. Therefore, after a predetermined time has elapsed after the input signal IN falls from the high level to the low level, the control circuits 39 and 40 output gate signals for turning off both the transistors 7 and 8. As a result, it is possible to suppress current from flowing from the transistor 7 to the transistor 4 and to decide the level of the output signal OUT by only the turn-on operation of only the transistor 4, so that the output signal (OUT) level is set to the low potential supply voltage GND.

Figure 3:
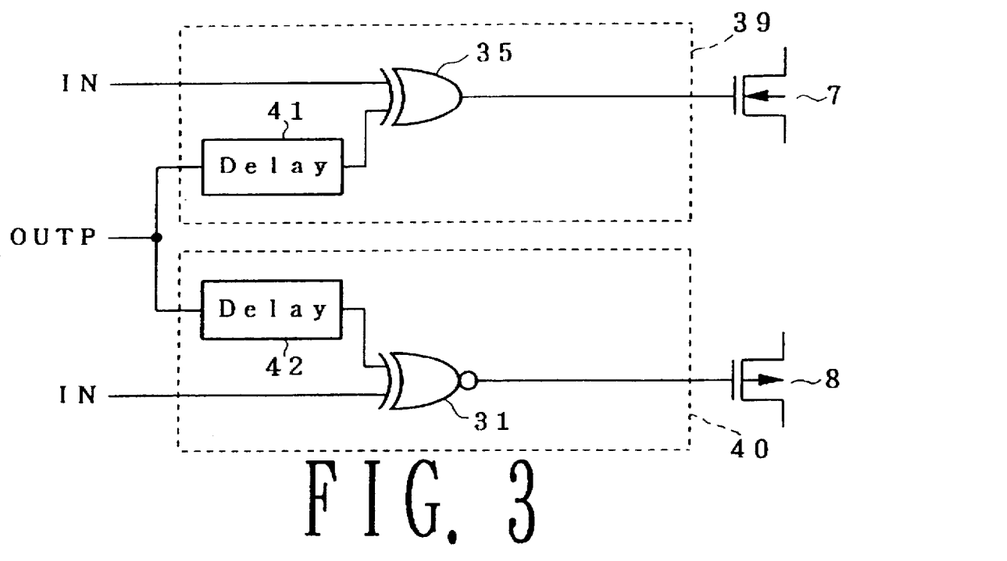
FIG. 3 is a circuit diagram showing a first second example of the control circuits shown in FIG. 1.

FIG. 3 shows a first example of the control circuits 39 and 40 included in the pulse output circuit device shown in FIG. 1.

As shown, the control circuit 39 is composed of an exclusive OR circuit 35 and a delay circuit 41. The input signal IN is directly inputted to the exclusive OR circuit 35; the output line OUTP is connected to the delay circuit 41; and the output of the delay circuit 41 is applied to the exclusive OR circuit 35. On the other hand, the control circuit 40 is composed of an exclusive NOR circuit 31 and another delay circuit 42. The input signal IN is directly inputted to the exclusive NOR circuit 31; the output line OUTP is connected to the delay circuit 42; and the output of the delay circuit 42 is applied to the exclusive NOR circuit 31.

Further, the output of the exclusive OR circuit 35 is applied to the gate of the transistor 7 as the output of the control circuit 39, and the output of the exclusive NOR circuit 31 is applied to the gate of the transistor 8 as the output of the control circuit 40.

The operation of the control circuits as shown in FIG. 3 will be explained hereinbelow.

When the input signal IN rises from the low level to the high level, the exclusive OR circuit 35 applies the high level input signal IN (as it is) to the gate of the transistor 7.

On the other hand, the exclusive NOR circuit 31 applies the low level input signal IN (inverted) to the gate of the transistor 8.

As a result, the transistors 7 and 8 are both changed from the turn-off mode to the turn-on mode, so that the parasitic capacitance 27 connected to the output line OUTP is charged by the transistors 2 and 7, quickly.

On the other hand, when the level of the output line OUTP rises beyond the operating point of the transistors 7 and 8 due to the charge of the parasitic capacitance 27, since the transistor 7 begins to be turned off and the transistor 8 is begins to be turned on, the parasitic capacitor 27 is charged through only the transistor 2, and further the charge current is absorbed by the transistor 8, as a result it is possible to suppress the overshoot.

On the other hand, when the level of the output line OUTP exceeds a constant level, after a constant delay time has elapsed, the high level signal is applied from the two delay circuits 41 and 42 to the exclusive OR circuit 35 and the exclusive NOR circuit 31, respectively. As a result, the output of the exclusive OR circuit 35 changes to the low level, and the output of the exclusive NOR circuit 31 changes to the high level. As a result, the two transistors 7 and 8 are both turned off, so that the level of the output line OUTP can be decided by only the high potential supply voltage VDD through the turned-on transistor 2.

Next, when the input signal IN falls from the high level to the low level, since the level of the input signal IN is inverted by the exclusive OR circuit 35, the control circuit 39 applies the high level signal IN to the gate of the transistor 7.

On the other hand, the exclusive NOR circuit 31 applies the low level input signal IN (as it is) to the gate of the transistor 8.

As a result, the transistors 7 and 8 are both changed from the turn-off mode to the turn-on mode, so that the parasitic capacitance 27 connected to the output line OUTP is discharged by the transistors 4 and 8, quickly.

On the other hand, when the level of the output line OUTP drops below the operating point of the transistors 7 and 8 with the advance of the discharge of the parasitic capacitance 27, since the transistor 8 begins to be turned off and the transistor 7 begins to be turned on, the parasitic capacitor 27 is discharged through only the transistor 4, and further the discharge current is absorbed by the transistor 7, as a result it is possible to suppress the undershoot.

On the other hand, when the level of the output line OUTP falls below a constant level, since the delay circuits 41 and 42 operate, after a constant delay time has elapsed, the low level signal is applied from the two delay circuits 41 and 42 to the exclusive OR circuit 35 and the exclusive NOR circuit 31, respectively. As a result, the output of the exclusive OR circuit 35 changes to the low level, and the output of the exclusive NOR circuit 31 changes to the high level. As a result, the two transistors 7 and 8 are both turned off, so that the level of the output line OUTP can be decided by only the low potential supply voltage GND through the turned-on transistor 4.

Figure 4:
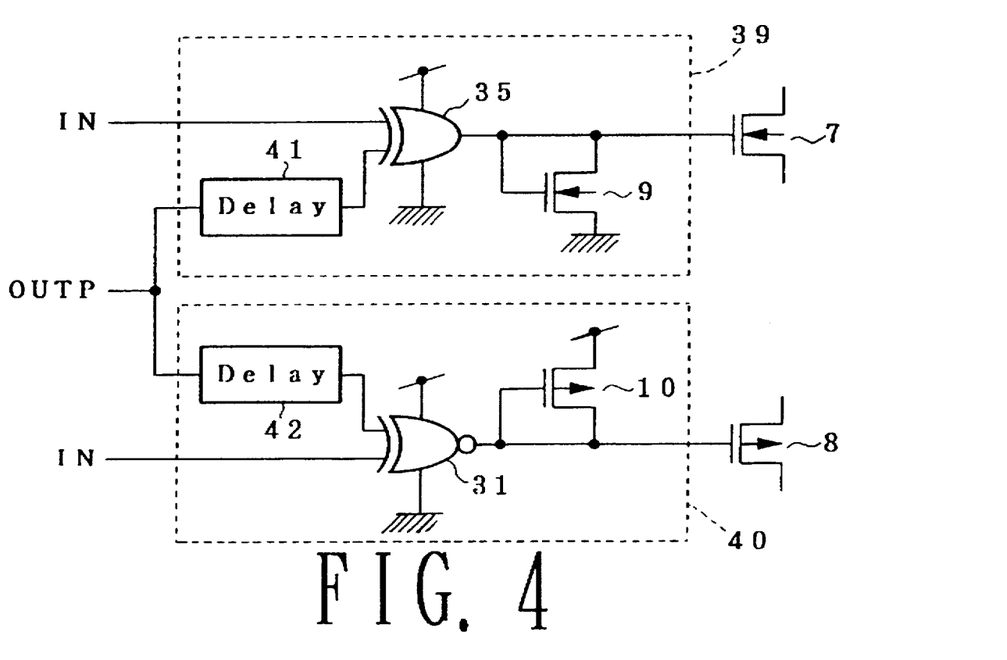
FIG. 4 is a circuit diagram showing a second example of the control circuits shown in FIG. 1.

FIG. 4 shows a second example of the control circuits 39 and 40 included in the pulse output circuit device shown in FIG. 1.

As shown, the output line of the exclusive OR circuit 35 for constructing the control circuit 39 is connected to the low potential supply voltage GND through an N-channel MOS transistor 9, to suppress the high level output of the control circuit 39.

On the other hand, the output line of the exclusive NOR circuit 31 for constructing the control circuit 40 is connected to the high potential supply voltage VDD through a P-channel MOS transistor 10, to suppress the low level output of the control circuit 40.

Therefore, since the output of the control circuit 39 is applied to the gate of the transistor 7, the operating point of the transistor 7 can be controlled at a relatively low level. On the other hand, since the output of the control circuit 40 is applied to the gate of the transistor 8, the operating point of the transistor 8 can be controlled at a relatively high level.

The operation of the circuit as shown in FIG. 4 will be explained hereinbelow.

When the input signal IN rises from the low level to the high level, the exclusive OR circuit 35 applies the high level input signal IN (as it is) to the gate of the transistor 7. In this case, however, this high level is set to a potential lower than the high potential supply voltage VDD by the operation of the transistor 9. This voltage is decided by the ratio of the turn-on resistance of the exclusive OR circuit 35 to the turn-on resistance of the transistor 9. Therefore, it is possible to reduce the dimensions of the transistor for constructing the exclusive OR circuit 35. The voltage obtained as described above is applied to the gate of the transistor 7 as the output of the control circuit 39.

On the other hand, since the input signal IN is inverted by the exclusive NOR circuit 31, the exclusive NOR circuit 31 applies the low level signal to the gate of the transistor 8. In this case, however, this low level is set to a potential higher than the low potential supply voltage GND by the operation of the transistor 10. This voltage is decided by the ratio of the turn-on resistance of the exclusive NOR circuit 31 to the turn-on resistance of the transistor 10. Therefore, it is possible to reduce the dimensions of the transistor for constructing the exclusive OR circuit 31. The voltage obtained as described above is applied to the gate of the transistor 8 as the output of the control circuit 40.

As a result, the transistor 7 is turned from off to on at a relatively low operating point, and the transistor 8 is turned from on to off at a relatively high operating point.

Now, the parasitic capacitance 27 charged quickly by the turn-on transistors 2 and 7 is charged only by the transistor 2, when the level of the output line OUTP rises beyond the operating point of the transistor 7 (set to a relatively low level by the transistor 9) and thereby the transistor 7 is turned off.

Further, with the advance of the charge of the parasitic capacitance 27, since the level of the output line OUTP further rises and thereby exceeds the operating point of the transistor 8 (set to a relatively high level by the transistor 10), since the transistor 8 begins to be turned on, the charge current of the parasitic capacitance 27 is absorbed by the transistor 8. In this case, the target point of the high level is set to a point lower than the high potential supply voltage VDD decided on the basis of the divided voltage ratio of the two transistors 2 and 8. As a result, it is possible to suppress the overshoot from the low level to the high level.

On the other hand, when the level of the output line OUTP rises beyond a constant level, after a predetermined delay time has elapsed, the high level signal is applied from the delay circuits 41 and 42 to the exclusive OR circuit 35 and the exclusive NOR circuit 31, respectively. As a result, the output of the exclusive OR circuit 35 changes to the low level, and the exclusive NOR circuit 31 changes to the high level. Accordingly, the transistors 7 and 8 are both turned off, so that the level of the output line OUTP can be decided by the high potential supply voltage VDD through the turn-on transistor 2.

On the other hand, when the input signal IN falls from the high level to the low level, the exclusive circuit 35 inverts the low level of the input signal IN and outputs the high level. In this case, this high level potential is set to a value lower than the high potential supply voltage VDD by the operation of the transistor 9.

The voltage obtained as described above is applied to the gate of the transistor 7 as the output of the control circuit 39.

On the other hand, the exclusive NOR circuit 31 outputs the low level input signal IN as it is to the transistor 8. In this case, this low level potential is set to a value higher than the low potential supply voltage GND by the operation of the transistor 10.

The voltage obtained as described above is applied to the gate of the transistor 8 as the output of the control circuit 40.

As a result, the transistor 7 is turned from off to on at a relatively low operating point, and the transistor 8 is turned from on to off at a relatively high operating point.

Now, the parasitic capacitance 27 discharged quickly by the turn-on transistors 4 and 8 is discharged through only the transistor 4, when the level of the output line OUTP rises beyond the operating point of the transistor 8 (set to a relatively high level by the transistor 10) and thereby the transistor 8 is turned off.

Further, with the advance of the discharge of the parasitic capacitance 27, since the level of the output line OUTP further falls and thereby drops below the operating point of the transistor 7 (set to a relatively low level by the transistor 9), when the transistor 7 begins to be turned on, the discharge current of the parasitic capacitance 27 is absorbed by the transistor 7. In this case, a target point of the low level is set to a point higher than the low potential supply voltage GND decided on the basis of the divided voltage ratio of the two transistors 4 and 7. As a result, it is possible to suppress the undershoot from the level to the low level.

On the other hand, when the level of the output line OUTP falls below a constant level, after a predetermined delay time has elapsed, the low level signal is applied from the delay circuits 41 and 42 to the exclusive OR circuit 35 and the exclusive NOR circuit 31, respectively. As a result, the output of the exclusive OR circuit 35 changes to the low level, and the exclusive NOR circuit 31 changes to the high level. Accordingly, the transistors 7 and 8 are both turned off, so that the level of the output line OUTP can be decided by the low potential supply voltage GND through only the turn-on transistor 4.

Figure 5:
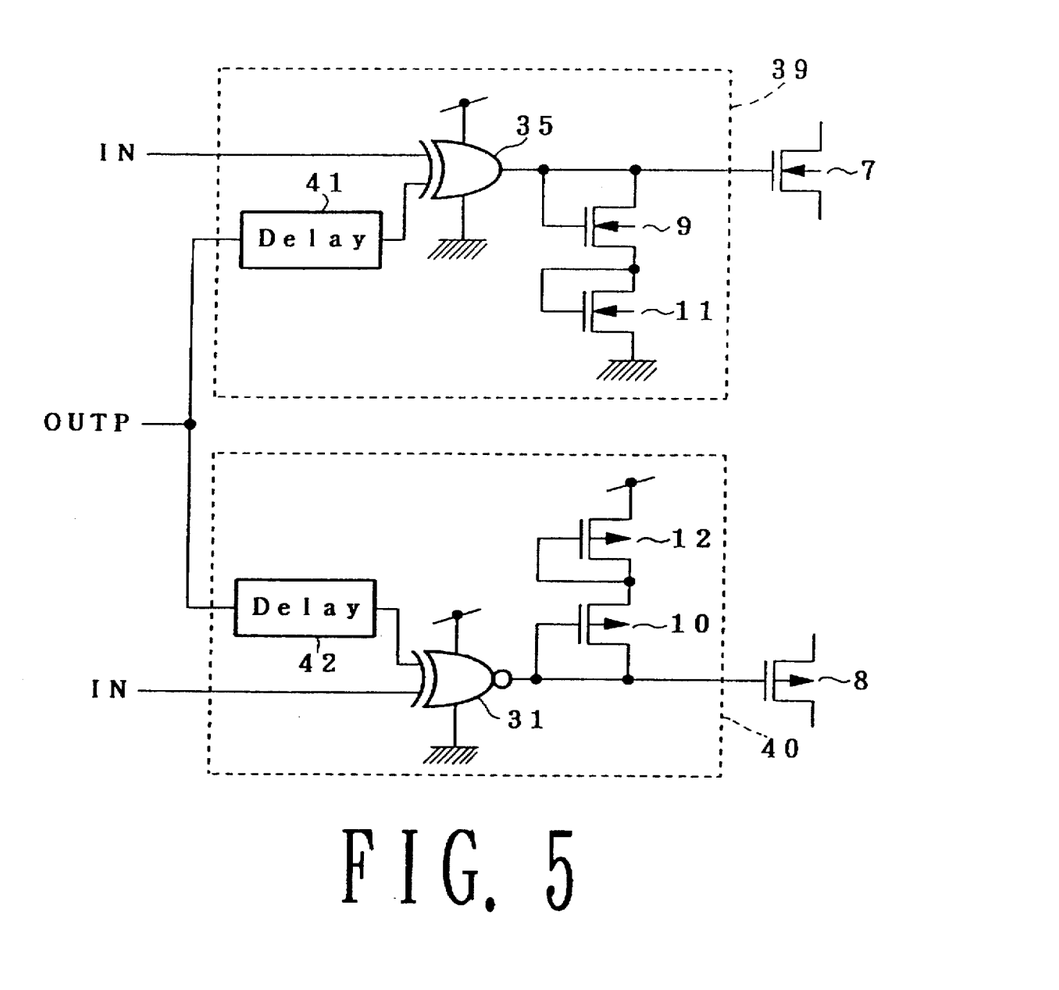
FIG. 5 is a circuit diagram showing a third example of the control circuits shown in FIG. 1.

FIG. 5 shows a third example of the control circuits 39 and 40 included in the circuit device shown in FIG. 1.

The circuit shown in FIG. 5 is different from the circuit shown in FIG. 4 in that an N-channel MOS transistor 11 is additionally connected to the transistor 9 in series and further a P-channel MOS transistor 12 is additionally connected to the transistor 12 in series.

In the circuit construction as shown in FIG. 5, since the high level output voltage of the exclusive OR circuit 35 can be increased by the serial circuit of the two transistors 9 and 11 both connected to the output side of the exclusive OR circuit 35, the operating point of the transistor 7 is set to a higher level in comparison with the circuit shown in FIG. 4. Further, since the low level output voltage of the exclusive NOR circuit 31 can be decreased by the serial circuit of the two transistors 10 and 12 both connected to the output side of the exclusive NOR circuit 31, the operating point of the transistor 8 is set to a lower level in comparison with the circuit shown in FIG. 4.

As a result, when the input signal IN changes from the low level to the high level, the transistor 7 is turned from on to off at a level higher than that of the circuit shown in FIG. 4, and the transistor 8 is turned from of to on at a level lower than that of the circuit shown in FIG. 4.

On the other hand, when the input signal IN changes from the high level to the low level, the transistor 8 is turned from on to off at a level lower than that of the circuit shown in FIG. 4, and the transistor 7 is turned from off to on at a level higher than that of the circuit shown in FIG. 4.

Figure 6:
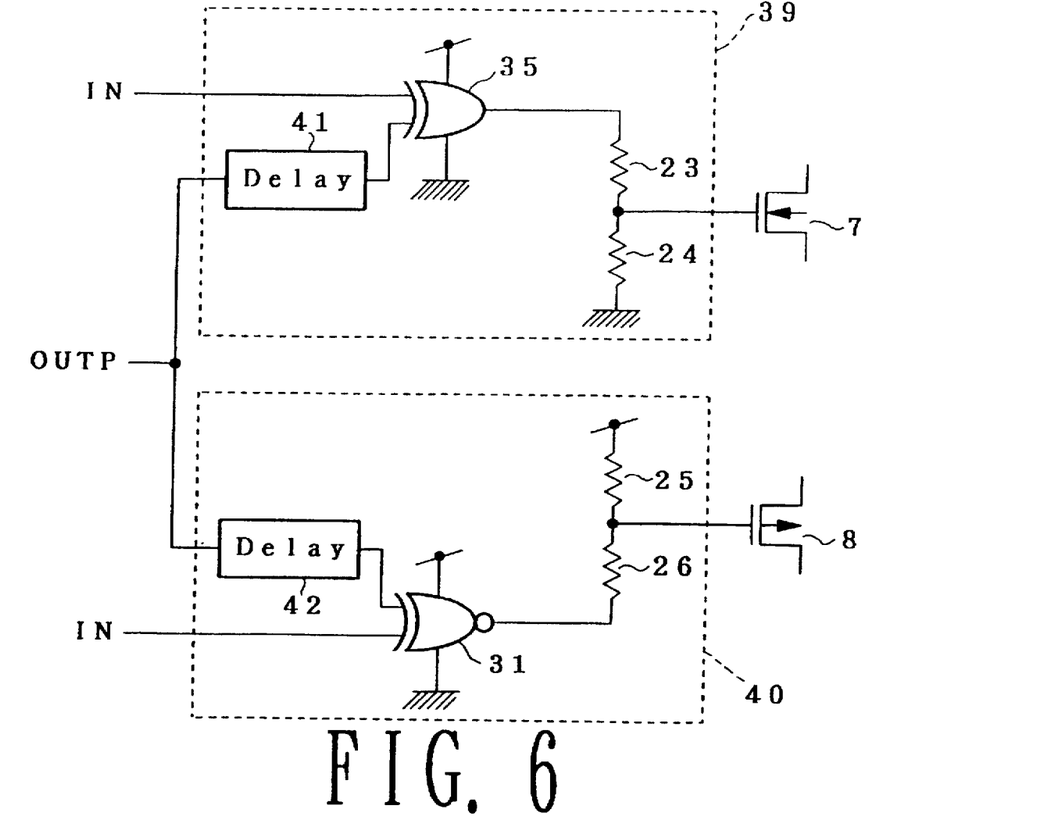
FIG. 6 is a circuit diagram showing a forth example of the control circuits shown in FIG. 1.

FIG. 6 shows a fourth example of the control circuits 39 and 40 included in the circuit device shown in FIG. 1.

The circuit shown in FIG. 6 is different from the circuit shown in FIG. 3 in that the output of the exclusive OR circuit 35 is divided by a voltage divider circuit composed of two resistors 23 and 24, and then applied to the gate of the transistor 7 as the output of the control circuit 39 and in the same way in that the output of the exclusive NOR circuit 31 is divided by a voltage divider circuit composed of two resistors 25 and 26, and then applied to the gate of the transistor 8 as the output of the control circuit 40.

In this circuit shown in FIG. 6, there exists such an advantage that the operating point of each of the transistors 7 and 8 can be decided freely by changing the divided voltage ratio by the two resistors 23 and 24 or the two resistors 25 and 26. The operation other than the above is basically the same as that of the circuits shown in FIGS. 4 and 5.

Figure 7:
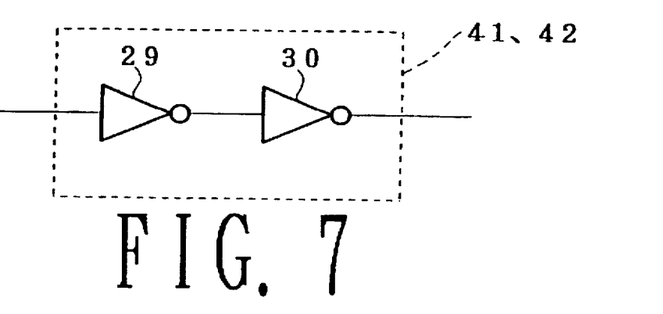
FIG. 7 is a circuit diagram showing a delay circuit included in the control circuits shown in FIGS. 3 to 6.

FIG. 7 shows an example of the delay circuits 41 and 42 shown in FIGS. 3 to 6. In FIG. 7, two inverters 29 and 30 are simply connected in series. When a longer delay time is required, the delay time of the two delay circuits 41 and 42 can be adjusted freely by changing the dimensions of the P-channel MOS transistor or the N-channel MOS transistor for constructing each inverter, by changing the number of inverters, or by forming another circuit under the condition that the same operation as with the case of the control circuit 49 or 40 can be obtained.

As described above, in the first embodiment of the pulse output circuit device according to the present invention, it is possible to suppress the overshoot, the undershoot and ringing, without degrading the pulse transmission characteristics and without increasing the circuit area markedly. In addition, since the charge/discharge circuit of the main buffer and the overshoot/undershoot suppressing circuit are constructed basically by two different circuits, respectively, it is possible to freely adjust or set the characteristics or the capacity thereof, independently.

Figure 8:
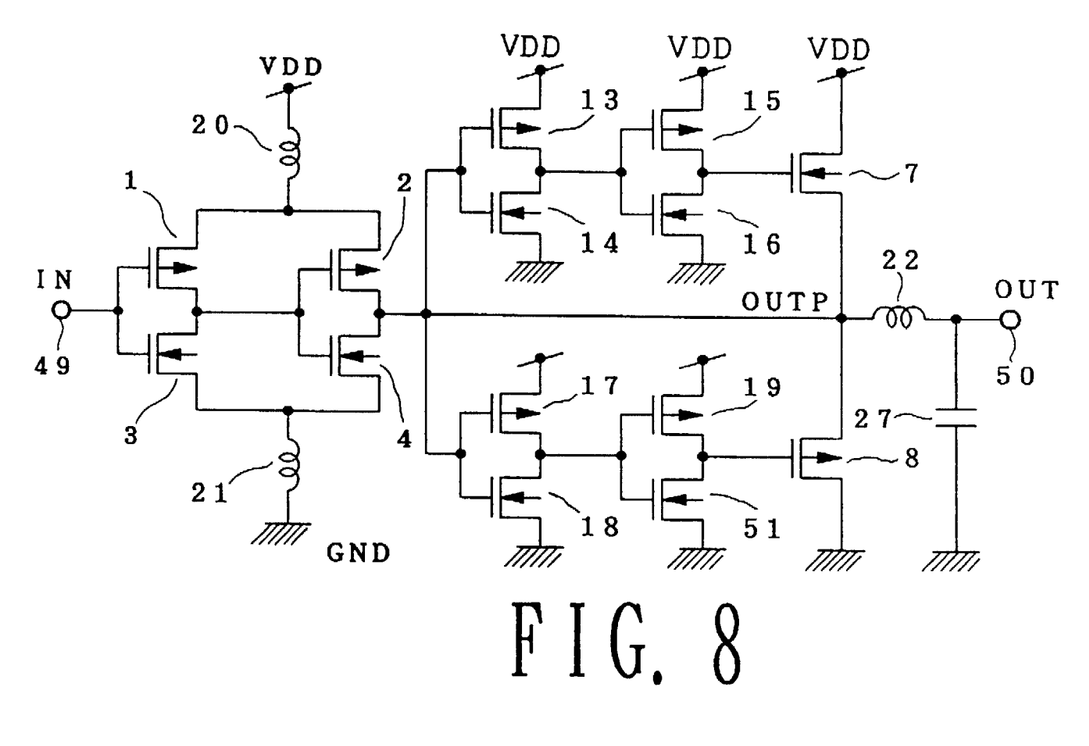
FIG. 8 is a circuit diagram showing a second embodiment of the pulse output circuit device according to the present invention.

FIG. 8 is a circuit diagram showing a second embodiment of the pulse output circuit device according to the present invention.

In this embodiment, the output buffer composed of the two transistors 2 and 4 applies a signal to the output line OUTP. The applied output signal is given to the transistor 7 via an inverter formed by connecting a P-channel MOS transistor 13 and an N-channel MOS transistor 14 complementarily and another inverter formed by connecting a P-channel MOS transistor 15 and an N-channel MOS transistor 16 complementarily. In other words, the control circuit receives only the output line signal OUTP, delays the received output line signal OUTP through the two directly connected inverters, and then applies the delayed output line signal OUTP to the gate of the transistor 7.

On the other hand, the applied output signal OUTP is given to the transistor 8 via an inverter formed by connecting a P-channel MOS transistor 17 and an N-channel MOS transistor 18 complementarily and another inverter formed by connecting a P-channel MOS transistor 19 and an N-channel MOS transistor 51 complementarily. In other words, the control circuit receives only the output line signal OUTP, delays the received output line signal OUTP through the two directly connected inverters, and then applied the delayed output line signal OUTP to the gate of the transistor 8.

The operation of the circuit shown in FIG. 8 will be explained hereinbelow.

When the input signal IN changes from the low level to the high level, the transistor 2 is turned on, so that the output line OUTP changes from the low level to the high level. This change in level causes a charge of the parasitic capacitor 27, so that this level changes according to the charged status of the parasitic capacitor 27.

At this time, the gate of the transistor 7 is at the low level and the gate of the transistor 8 is also at the low level, the transistor 7 is turned off and the transistor 8 tends to be turned on. In this case, however, when the voltage of the output line OUTP is lower than the operating point of the transistor 8, the transistor 8 is kept turned off.

When the voltage of the output line OUTP exceeds the operating point of the transistor 8, since the transistor 8 is turned on, the charge current flowing from the transistor 2 to the parasitic capacitor 27 is absorbed by the transistor 8. Further, the voltage of the output line OUTP is decided on the basis of the ratio of the turn-on resistance of the transistor 2 to that of the transistor 8; that is, the output line voltage changes to a voltage lower than the high potential supply voltage VDD. As a result, it is possible to suppress the overshoot of the output line OUTP.

Further, when a constant time has elapsed after the output line OUTP changed to the high level, the gates of the two transistors 7 and 8 change to the high level.

As a result, the transistor 8 is turned off and the transistor 7 tends to be turned on. In this case, however, since the voltage of the output line OUTP exceeds the operating point of the transistor 7, the transistor 7 is kept turned off. As a result, the voltage of the output line OUTP can be decided by the high potential supply voltage VDD.

On the other hand, when the input signal IN changes from the high level to the low level, the transistor 4 is turned off, so that the output line OUTP changes from the high level to the low level. This change in level causes a discharge of the parasitic capacitor 27, so that this level changes according to the discharged status of the parasitic capacitor 27.

At this time, the gate of the transistor 7 is at the high level and the gate of the transistor 8 is also at the high level, the transistor 8 is turned off and the transistor 7 tends to be turned on. In this case, however, when the voltage of the output line OUTP is higher than the operating point of the transistor 7, the transistor 7 is kept turned off.

When the voltage of the output line OUTP falls below the opeating point of the transistor 7, since the transistor 7 is turned on, the discharge current flowing from the parasitic capacitor 27 to the transistor 4 is absorbed by the transistor 7. Further, the voltage of the output line OUTP is decided on the basis of the ratio of the turn-on resistance of the transistor 4 to that of the transistor 7; that is, the output line voltage changes to a voltage higher than the low potential supply voltage GND. As a result, it is possible to suppress the undershoot of the output line OUTP.

Further, when a constant time has elapsed after the output line OUTP changed to the low level, the gates of the two transistors 7 and 8 change to the low level.

As a result, the transistor 7 is turned off and the transistor 8 tends to be turned on. In this case, however, since the voltage of the output line OUTP falls below the operating point voltage of the transistor 8, the transistor 8 is kept turned off. As a result, the voltage of the output line OUTP can be decided by the low potential supply voltage GND.

As described above, in the second embodiment of the pulse output circuit device according to the present invention, it is possible to suppress the overshoot and the undershoot, without degrading the pulse transmission characteristics and without increasing the circuit area markedly. In addition, since the charge and discharge circuit of the main buffer and the overshoot and undershoot suppressing circuit are constructed basically by two different circuits, respectively, it is possible to freely adjust or set the characteristics or the capacity thereof, independently.

In the pulse output circuit device according to the present invention, since the pulse rise/fall time can be sharpened under control of the auxiliary transistors connected to the output buffer, and further since the overshoot and/or undershoot can be controlled so as not to exceed the high and low potential supply voltages VDD and GND, it is possible to suppress the overshoot and the undershoot of the pulse output circuit device effectively, without increasing the dimensions of the output buffer markedly and without reducing the response speed of the entire pulse output circuit device, with the result that it is possible to prevent an erroneous operation of the pulse output circuit device or the latch-up of another external circuit connected to the pulse output circuit device.

What is claimed is:

1. An output device comprising:

an input terminal;

an output terminal;

a buffer having a buffer input terminal connected to said input terminal and a buffer output terminal connected to said output terminal, for outputting an output pulse through the buffer output terminal in response to an input pulse applied to said input terminal;

an N-channel transistor and a P-channel transistor, a drain of said N-channel transistor being connected to a high potential supply voltage, a source of said N-channel transistor being connected to a source of said P-channel transistor, a drain of said P-channel transistor being connected to a low potential supply voltage, and a junction point between the source of said N-channel transistor and the source of said P-channel transistor, the junction point being connected to the buffer output terminal;

a first control circuit having a first input terminal connected to said input terminal, a second input terminal connected to the buffer output terminal, and a first output terminal connected to a gate of said N-channel transistor;

wherein whenever a level of the input pulse changes, the first control circuit outputs a first control signal for first turning on said N-channel transistor and then turning off said N-channel transistor after a predetermined time has elapsed, wherein said predetermined time is determined on the basis of inputs applied to the first and second input terminals of the first control circuit; and a second control circuit having a third input terminal connected to said buffer output, a fourth input terminal connected to the input terminal, and a second output terminal connected to a gate of said P-channel transistor;

wherein whenever the level of the input pulse changes, the second control circuit outputs a second control signal for first turning on said P-channel transistor and then turning off said P-channel transistor after a predetermined time has elapsed, wherein said predetermined time is determined on the basis of inputs applied to the third and fourth input terminals of the second control circuit, wherein said buffer comprises an input buffer, connected to said input buffer terminal, and an output buffer, connected in series between said input buffer and said output buffer terminal.

2. The output circuit device of claim 1, wherein a parasitic capacitor is connected between said output terminal and the low potential supply voltage.

3. The output circuit device of claim 2, wherein a parasitic inductance is connected between said output terminal and the buffer output terminal of said buffer.

4. The output circuit device of claim 1, wherein:

said input buffer includes a P-channel transistor having a gate connected to the buffer input terminal, a source connected to a first common source, and a drain connected to a first common node, and an N-channel transistor having a gate connected to the buffer input terminal, a source connected to a second common source, and a drain connected to the first common node;

said output buffer includes a P-channel transistor having a gate connected to the first common node, a source connected to the first common source, and a drain connected to said buffer output terminal, and an N-channel transistor having a gate connected to the first common node, a source connected to the second common node, and a drain connected to said buffer output terminal; and wherein the first common source is connected to the high potential supply voltage, and the second common source is connected to the low potential supply voltage.

5. The output circuit device of claim 4 wherein a first parasitic inductance is connected between the first common source and the high potential supply voltage and a second parasitic inductance is connected between the second common source and the low potential supply voltage.

6. An output device comprising:

an buffer terminal;

an output terminal;

a buffer having a buffer input terminal connected to said input terminal and a buffer output terminal connected to said output terminal, for outputting an output pulse through the buffer output terminal in response to an input pulse applied to said input terminal;

an N-channel transistor and a P-channel transistor, a drain of said N-channel transistor being connected to a high potential supply voltage, a source of said N-channel transistor being connected to a source of said P-channel transistor, a drain of said P-channel transistor being connected to a low potential supply voltage, and a junction point between the source of said N-channel transistor and the source of said P-channel transistor, the junction point being connected to the buffer output terminal;

a first control circuit having a first input terminal connected to said input terminal, a second input terminal connected to the buffer output terminal, and a first output terminal connected to a gate of said N-channel transistor;

wherein whenever a level of the input pulse changes, the first control circuit outputs a first control signal for first turning on said N-channel transistor and then turning off said N-channel transistor after a predetermined time has elapsed, wherein said predetermined time is determined on the basis of inputs applied to the first and second input terminals of the first control circuit; and a second control circuit having a third input terminal connected to said buffer output, a fourth input terminal connected to the input terminal, and a second output terminal connected to a gate of said P-channel transistor;

wherein whenever the level of the input pulse changes, the second control circuit outputs a second control signal for first turning on said P-channel transistor and then turning off said P-channel transistor after a predetermined time has elapsed, wherein said predetermined time is determined on the basis of inputs applied to the third and fourth input terminals of the second control circuit;

wherein said first control circuit further comprises an exclusive OR circuit having a first terminal, a second terminal, and an output terminal, the first terminal of said exclusive OR circuit being the first input terminal of said first control circuit and the second terminal of said exclusive OR circuit being connected to the second input terminal of said first control circuit via a first delay circuit, and the output terminal of said exclusive OR circuit being the first output terminal of said first control circuit; and wherein said second control circuit further comprises an exclusive NOR circuit having a first terminal, a second terminal, and an output terminal, the first terminal of said exclusive NOR circuit being connected to the third input terminal of said second control circuit via a second delay circuit and the second terminal of said exclusive NOR circuit being the fourth input terminal of said second control circuit, and the output terminal of said exclusive NOR circuit being the second output terminal of said second control circuit.

7. The output circuit device of claim 6, wherein a parasitic capacitor is connected between said output terminal and the low potential supply voltage.

8. The output circuit device of claim 7, wherein a parasitic inductance is connected between said output terminal and the buffer output terminal of said buffer.

9. The output circuit device of claim 6, wherein the output terminal of said exclusive OR circuit of said first control circuit is connected to the low potential supply voltage via a first connecting means, and the output terminal of said exclusive NOR circuit of said second control circuit is connected to the high potential supply voltage via a second connecting means.

10. The output circuit device of claim 9, wherein said first connecting means is a N-channel transistor having a gate connected to the output terminal of the exclusive OR circuit, and a drain connected to the drain of the N-channel transistor of the first connecting means, and said second connecting means is a P-channel transistor having a gate connected to the output terminal of the exclusive NOR circuit, and a drain connected to the drain of the P-channel transistor of the second connecting means.

11. The output circuit device of claim 9, wherein said first connecting means is a pair of series-connected N-channel transistors each having a gate and a drain connected together, and said second connecting means is a pair of series-connected P-channel transistor each having a gate and a drain connected together.

12. The output circuit device of claim 9, wherein the first connect means further comprises
a first resistor connected between the output terminal of said exclusive OR circuit and the first output terminal of said first control circuit, and
a second resistor connected between the first output terminal and the low potential supply voltage; and wherein the second connect means further comprises
a third resistor is connected between the output terminal of said exclusive NOR circuit and the second output terminal of said second control circuit, and a fourth resistor is connected between the second output terminal and the high potential supply voltage.

13. An output device comprising:

an input terminal;

an output terminal;

a buffer having a buffer input terminal connected to said input terminal and a buffer output terminal connected to said output terminal, for outputting an output pulse through the buffer output terminal in response to an input pulse applied to said input terminal;

an N-channel transistor and a P-channel transistor, a drain of said N-channel transistor being connected to a high potential supply voltage, a source of said N-channel transistor being connected to a source of said P-channel transistor, a drain of said P-channel transistor being connected to a low potential supply voltage, and a junction point between said source of said N-channel transistor and said source of said P-channel transistor, the junction point being connected to the buffer output terminal;

a first delay circuit having
an input terminal connected to the buffer output terminal of said buffer, and
an output terminal connected to a gate of said N-channel terminal; and a second delay circuit having
an input terminal connected to the buffer output terminal of said buffer, and
an output terminal connected to a gate of said P-channel transistor;

wherein said first delay circuit and said second delay circuit each comprise a plurality of series-connected inverters.

14. The output circuit device of claim 13, wherein each of the series-connected inverters comprises complementary-connected P- and N-channel transistors.

15. The output circuit device of claim 13, wherein a parasitic capacitor is connected between said output terminal and the low potential supply voltage.

16. The output circuit device of claim 15, wherein a parasitic inductance is connected between said output terminal and the buffer output terminal of said buffer.

17. An output device comprising:

an input terminal;

an output terminal;

a buffer having a buffer input terminal connected to said input terminal and a buffer output terminal connected to said output terminal, for outputting an output pulse through the buffer output terminal in response to an input pulse applied to said input terminal;

an N-channel transistor and a P-channel transistor, a drain of said N-channel transistor being connected to a high potential supply voltage, a source of said N-channel transistor being connected to a source of said P-channel transistor, a drain of said P-channel transistor being connected to a low potential supply voltage, and a junction point between said source of said N-channel transistor and said source of said P-channel transistor, the junction point being connected to the buffer output terminal;

a first delay circuit having an input terminal connected to the buffer output terminal of said buffer, and an output terminal connected to a gate of said N-channel transistor; and a second delay circuit having an input terminal connected to the buffer output terminal of said buffer, and an output terminal connected to a gate of said P-channel transistor;

wherein said buffer comprises an input buffer, connected to said input buffer terminal, and an output buffer, connected in series between said input buffer and said output buffer terminal.

18. The output circuit device of claim 17, wherein:

said input buffer includes a P-channel transistor having a gate connected to the buffer input terminal, a source connected to a first common source, and a drain connected to a first common node, and an N-channel transistor having a gate connected to the buffer input terminal, a source connected to a second common source, and a drain connected to the first common node;

said output buffer includes a P-channel transistor having a gate connected to the first common node, a source connected to the first common source, and a drain connected to said buffer output terminal, and an N-channel transistor having a gate connected to the first common node, a source connected to the second common node, and a drain connected to said buffer output terminal; and wherein the first common source is connected to the high potential supply voltage, and the second common source is connected to the low potential supply voltage.

19. The output circuit device of claim 18, wherein a first parasitic inductance is connected between the first common source and the high potential supply voltage and a second parasitic inductance is connected between the second common source and the low potential supply voltage.

20. The output circuit device of claim 17, wherein a parasitic capacitor is connected between said output terminal and the low potential supply voltage.

21. The output circuit device of claim 20, wherein a parasitic inductance is connected between said output terminal and the buffer output terminal of said buffer.

* * * * *